United States Patent
Roy et al.

(10) Patent No.: US 6,856,542 B2
(45) Date of Patent: Feb. 15, 2005

(54) PROGRAMMABLE LOGIC DEVICE CIRCUIT AND METHOD OF FABRICATING SAME

(75) Inventors: Anirban Roy, Sunnyvale, CA (US); Luca Giovanni Fasoli, San Jose, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/164,245

(22) Filed: Jun. 4, 2002

(65) Prior Publication Data

US 2003/0222309 A1 Dec. 4, 2003

(51) Int. Cl.$^7$ .............................................. G11C 14/00
(52) U.S. Cl. ............................ 365/185.08; 365/185.05; 365/185.33
(58) Field of Search ............................. 365/205, 185.33, 365/185.07, 185.24, 185.05, 185.08

(56) References Cited

U.S. PATENT DOCUMENTS

| | | | | | |
|---|---|---|---|---|---|
| 4,761,768 | A | * | 8/1988 | Turner et al. | 365/185.22 |
| 4,833,646 | A | * | 5/1989 | Turner | 326/44 |
| 4,912,677 | A | * | 3/1990 | Itano et al. | 365/185.22 |
| 5,574,857 | A | * | 11/1996 | Ramakrishnan et al. | 714/54 |
| 5,982,683 | A | * | 11/1999 | Watson et al. | 365/201 |
| 6,282,122 | B1 | * | 8/2001 | Sansbury | 365/185.24 |

* cited by examiner

Primary Examiner—Richard Elms
Assistant Examiner—Hien Nguyen
(74) Attorney, Agent, or Firm—Lisa K. Jorgenson; Andre Szuwalski

(57) ABSTRACT

A programmable logic device (PLD) and method for fabricating the PLD are disclosed. The PLD includes an array of PLD cells. Each PLD cell may include a programmable transistor and a select transistor. The PLD array is divided into at least one first area and at least one second area adjacent the at least one first area. The at least one first area includes the programmable transistors and the at least one second area includes the select transistors.

42 Claims, 4 Drawing Sheets

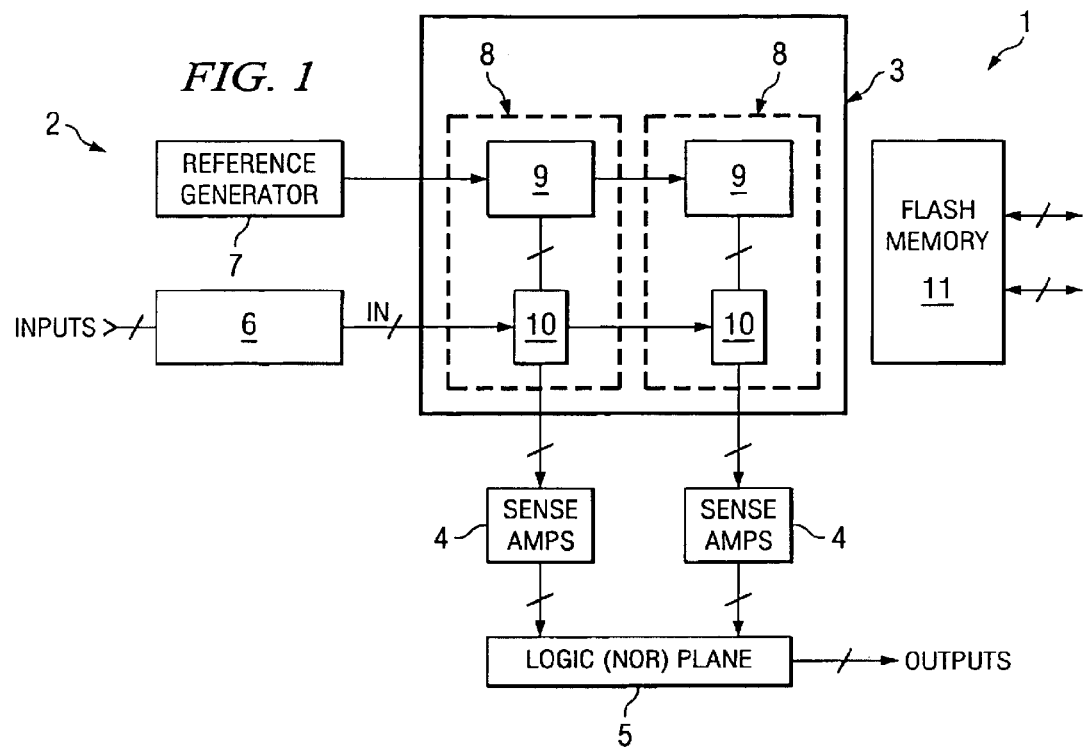
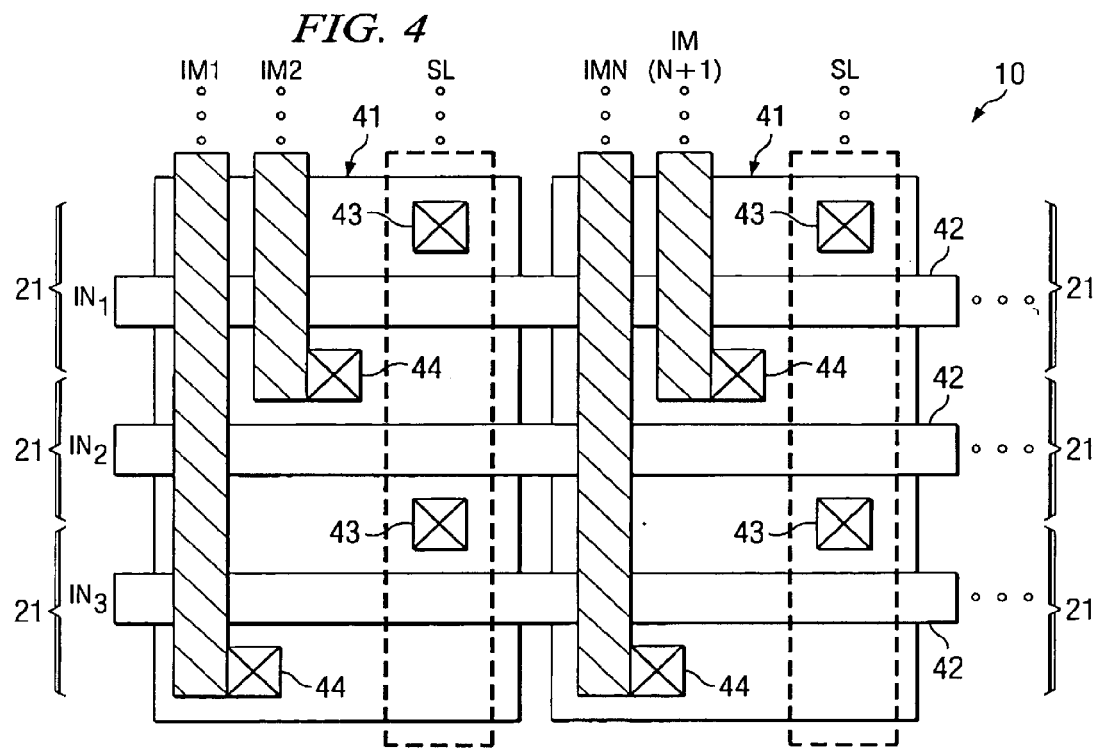

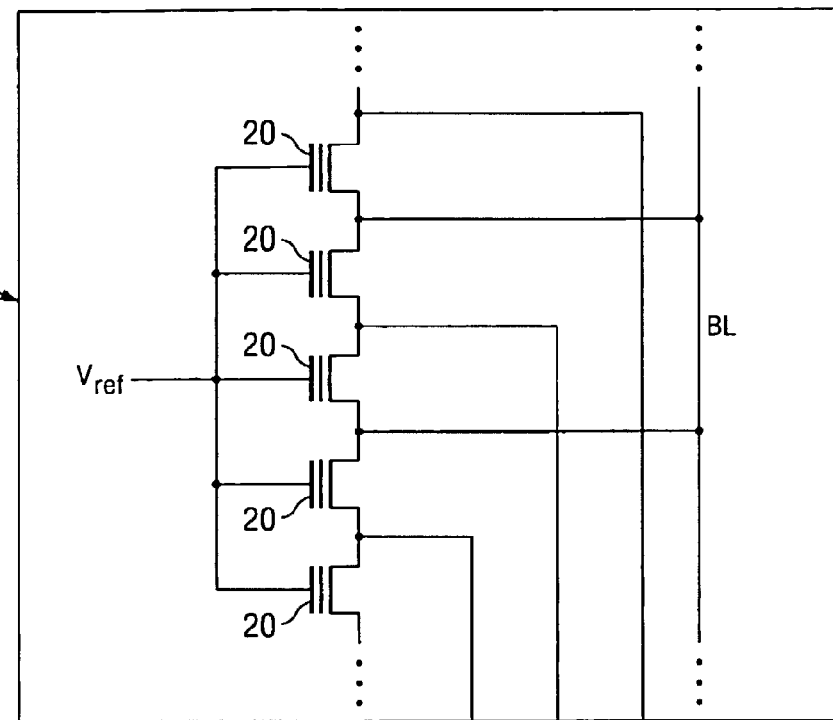
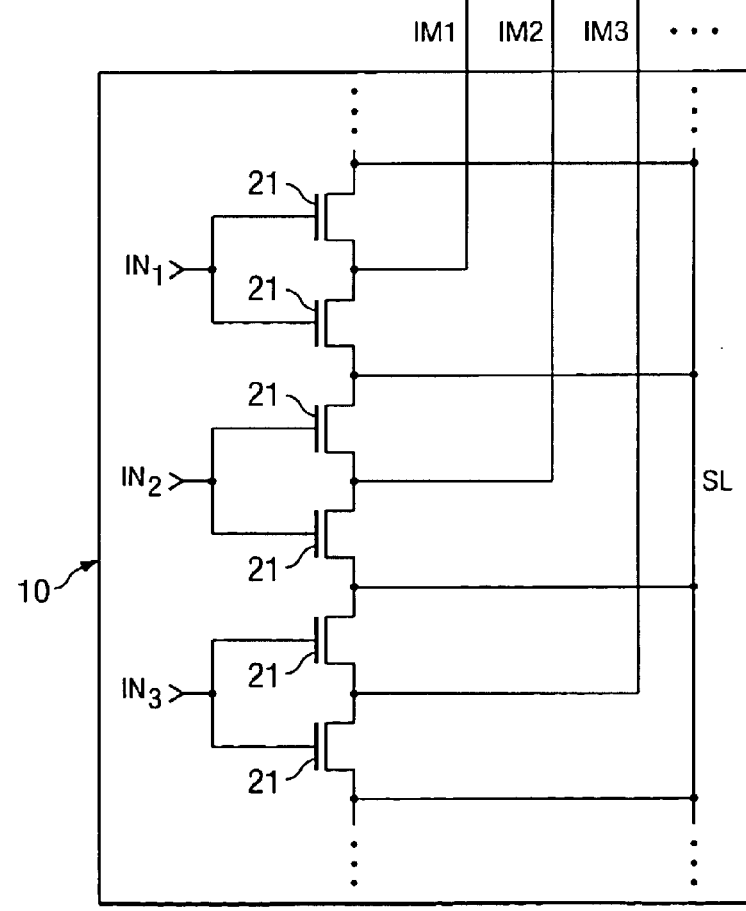
*FIG. 2*

PROGRAMMABLE LOGIC DEVICE CIRCUIT AND METHOD OF FABRICATING SAME

BACKGROUND OF THE INVENTION

1. Technical Field of the Invention

The present invention relates to programmable logic devices (PLDs), and particularly to PLDs that may be fabricated more simply and less expensively.

2. Description of the Related Art

Programmable logic devices (PLDs) have been in existence for some time. A conventional PLD may include a plurality of PLD cells, each of which is programmable/erasable into any of at least two states. Some conventional PLD cells utilized the EEPROM technology in which a programmable thin oxide capacitor conducts a small current when a sufficient voltage is applied across the oxide. The tunnel oxide is used to inject or extract charge from a floating gate connected to a sense transistor, which itself senses the programmed state of the thin oxide capacitor. Two additional transistors (a program transistor and a read transistor) and a control capacitor are included in this EEPROM-based PLD cell.

In part due to the rather sizable space occupied by the above-described EEPROM-based PLD cell, other technologies have been employed to provide a more compact PLD cell. The flash memory process has been utilized in PLDs. In a flash-based PLD cell, a flash floating gate transistor forms the programmable component. The flash-based PLD cell further includes a series-select transistor connected in series with the floating gate transistor. The gate/control terminal of the select transistor is coupled to a word line which selects or activates the PLD cell. The transistors in the conventional flash-based PLD cell (the select transistor and the flash floating gate transistor) are disposed adjacent each other on a PLD chip. Flash-based PLD cells offer increased density while being relatively compatible with leading nonvolatile memory technologies.

A shortcoming with conventional flash-based PLDs concerns integrating the flash floating gate transistor with a regular select transistor in an integrated circuit chip. In particular, there is a different process flow for fabricating the floating gate transistor relative to the process flow for fabricating the select transistor. Reliability issues relating to defectivity and tunnel oxide integrity have been experienced at each transition of a flash floating gate transistor and an adjacent regular select transistor.

Based upon the foregoing, there is a need for a reliable PLD cell that is fabricated in a cost effective manner and provides relatively high cell density.

SUMMARY OF THE INVENTION

Exemplary embodiments of the present invention overcome shortcomings with prior PLD devices and satisfy significant advantages by providing a PLD device that is simply and efficiently fabricated. The PLD device according to exemplary embodiments of the present invention is fabricated using substantially the same design rules utilized by a nonvolatile memory. In this way, an integrated circuit, such as an application specific integrated circuit (ASIC) having both a nonvolatile memory device and a PLD device may be fabricated with a reduced set of fabrication steps.

In accordance with an exemplary embodiment of the present invention, there is shown a PLD device having a plurality of nonvolatile and/or programmable transistors, such as floating gate transistors, disposed in at least one first area of an integrated circuit. The term "nonvolatile memory transistor" will be used throughout the specification to refer to transistors that may be programmed to be in any one of at least two distinct, nonvolatile operational states. A plurality of select transistors are disposed in at least one second area adjacent the at least one first area. The nonvolatile memory transistors in the first area are coupled to the select transistors in the second area to form the PLD cells of the PLD. By separating or otherwise isolating the nonvolatile memory transistors from their corresponding select transistors, the design/processing rules for fabricating the core of a conventional flash memory device may be relatively easily utilized in fabricating the PLD, thereby better ensuring first time success for PLD array operation.

BRIEF DESCRIPTION OF THE DRAWINGS

A more complete understanding of the system and method of the present invention may be obtained by reference to the following Detailed Description when taken in conjunction with the accompanying Drawings wherein:

FIG. 1 is a block diagram of an integrated circuit chip having a PLD device according to an exemplary embodiment of the present invention;

FIG. 2 is a schematic of a portion of the PLD device of FIG. 1;

FIG. 4 is a top elevational view of select transistors of the PLD device of FIG. 1;

DETAILED DESCRIPTION OF THE EXEMPLARY EMBODIMENTS

Figure 3:
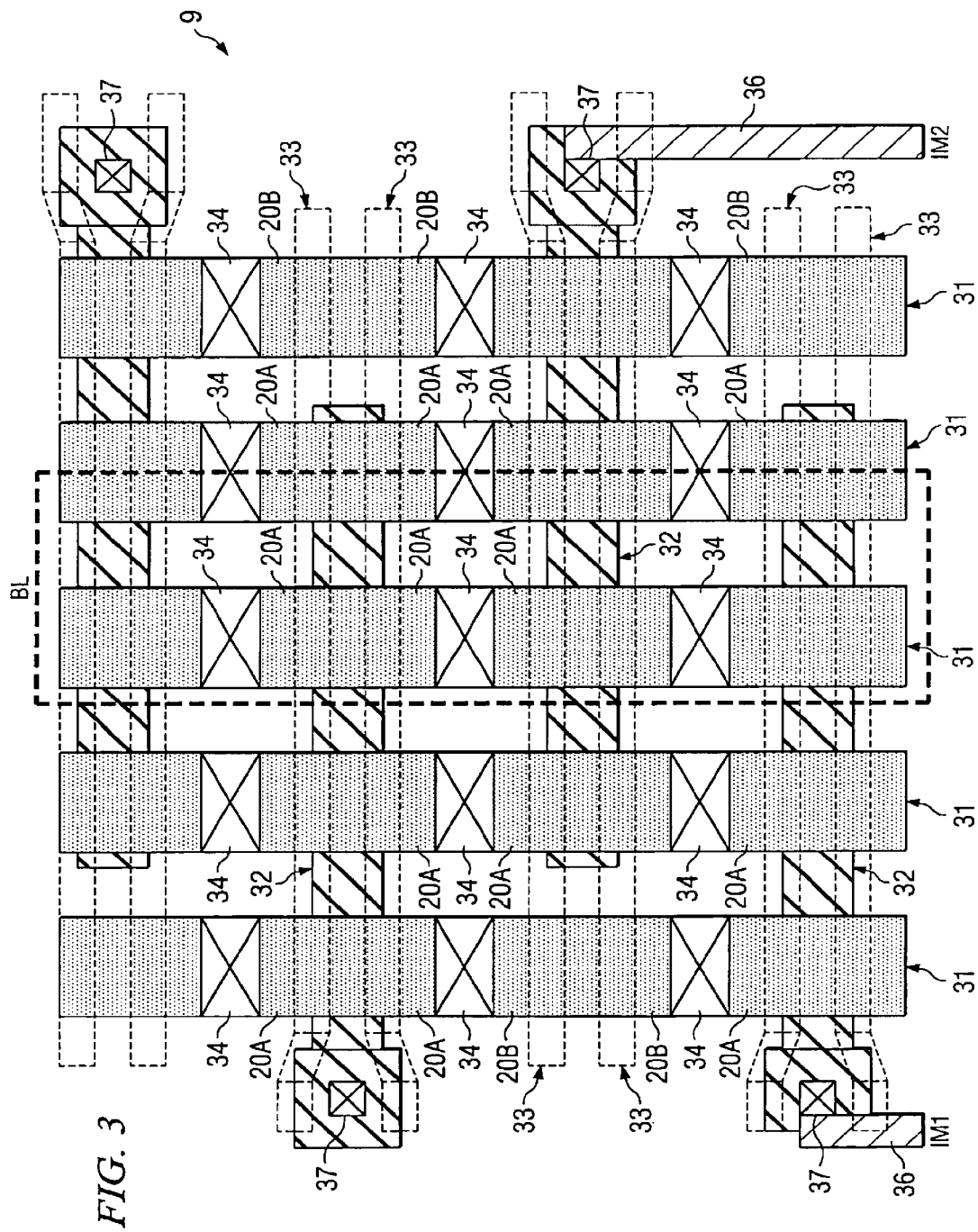
FIG. 3 is a top elevational view of nonvolatile memory transistors of the PLD device of FIG. 1.

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Referring to FIG. 1, there is shown a block diagram of an integrated circuit chip 1 according to an exemplary embodiment of the present invention. Integrated circuit chip 1 may be, for example, an application specific integrated circuit (ASIC). A portion of integrated circuit chip 1 includes a programmable logic device (PLD) 2. Just as with conventional PLDs, PLD 2 is capable of being programmed to perform any one or more of a wide variety of logical operations. PLD 2 receives a plurality of inputs and generates one or more output signals based upon the logical operations programmed therein.

PLD 2 may include an array 3 of PLD cells. Each PLD cell in PLD 2 may include a nonvolatile memory transistor connected in series with a select transistor. The series connection of the nonvolatile memory transistor and the select transistor may be disposed between a bit line and a source line. Accordingly, array 3 may include a plurality of bit lines and source lines, wherein for each pair of a bit line and corresponding source line, a plurality of PLD cells are connected in parallel therebetween. PLD 2 may further include sense amplifier circuits 4 which are disposed adjacent array 3 for receiving the source lines from array 3, measuring current levels thereon and generating output signals having logic levels corresponding to the current levels sensed. Because sense amplifier circuits 4 are well known in the art, a detailed description of sense amplifier circuits 4 will not be included for reasons of simplicity.

The output signals of sense amplifier circuits 4 may be received by a logic plane 5. Logic plane 5 may include circuitry for receiving the output signals of the sense amplifier circuits 4 and performing various boolean logic operations. For example, logic plane 5 may include circuitry that performs a plurality of logic NOR operations. Because the use of logic planes are known in PLD designs, a detailed description of logic plane 5 will not be described in greater detail for reasons of simplicity.

PLD 2 may include input circuitry 6 coupled between a plurality of input signals of PLD 2 and array 3. Input circuitry 6 may condition the input signals and apply the conditioned input signals to the PLD cells in array 3. The conditioned input signals may be coupled to the gate/control terminal of the select transistor of the PLD cells in array 3. PLD 2 may further include reference generator circuitry 7 which generates and applies a predetermined voltage level on the control terminals of the nonvolatile memory transistors in array 3 so that each PLD cell may generate a signal representing one of a plurality of logic values upon activation of the select transistor of the PLD cell.

As stated above, each PLD cell in array 3 includes a series connection of a nonvolatile memory transistor and a select transistor disposed between a source line and a bit line. In contrast to conventional PLD cells in which the nonvolatile memory transistor and the select transistor of each PLD cell are disposed immediately adjacent each other, according to an exemplary embodiment of the present invention, the nonvolatile memory transistor and select transistor of each PLD cell are disposed in different portions of array 3. In particular, array 3 may be divided into a plurality of PLD cell blocks 8 (FIG. 8), each of which includes a first area 9 of nonvolatile memory cells and a second area 10 of select transistors. For each block 8 of PLD cells, the nonvolatile memory cells are located in the first area 9 and the corresponding select transistors are located in the second area 10. For each block 8, second area 10 may be disposed adjacent to first area 9. By separating, in the physical layout of integrated circuit chip 1, the nonvolatile memory transistors from their corresponding select transistors, the fabrication of integrated circuit chip 1 is substantially simplified, as described in greater detail below. In addition, separating the nonvolatile memory transistors from their corresponding select transistors in integrated circuit chip 1 relatively easily allows for the use of a known flash memory technology and particularly the implementation of the nonvolatile memory transistors as flash memory transistors.

Although FIG. 1 shows each block 8 of PLD cells as having a single first area 9 of nonvolatile memory transistors and a single second area 10 of select transistors, it is understood that any one or more block 8 of PLD cells may include more than one first area 9 of nonvolatile memory transistors or more than one second area 10 of select transistors. With respect to the latter, a block 8 of PLD cells may include two second areas 10 of select transistors that are associated with the nonvolatile memory transistors in a single first area 9, with the single first area 9 being disposed between the two second areas 10.

FIG. 2 is a circuit schematic of a portion of a block 8 of PLD cells. Each PLD cell may be formed of a nonvolatile memory transistor 20 series connected with a select transistor, whereby the gate terminal of the select transistor forms the input of the PLD cell. The gate terminal of each nonvolatile memory transistor 20 is coupled to a voltage reference from reference generator circuitry 7. The nonvolatile memory transistors 20 in first area 9 may be fabricated end-to-end. The drain terminal of each nonvolatile memory transistor 20 may be coupled to a bit line BL and the source terminal of each nonvolatile memory transistor 20 may be coupled to a distinct intermediate line IM. The select transistors 21 in second area 10 may be connected/fabricated end-to-end. Select transistors 21 may be field effect transistors. Select transistors 21 may be grouped in pairs. For each pair of select transistors 21, the select transistors 21 may be connected in parallel so as to effectively form a single select transistor of a PLD cell. The source terminal of select transistor 21 in each pair of select transistors may be coupled to a source line SL and the drain terminal coupled to a distinct intermediate line IM. The intermediate lines IM thus form the connection between the nonvolatile memory transistors and the corresponding select transistors. As can be seen, a plurality of PLD cells may be formed between a bit line BL and a source line SL.

It is understood that each block 8 of PLD cells may include a plurality of pairs of bit lines BL and source line SL, wherein for each pair of a bit line BL and a source line SL, a plurality of PLD cells are coupled therebetween.

An exemplary layout of a portion of first area 9 is illustrated in FIG. 3. Specifically, FIG. 3 shows a plurality of nonvolatile memory transistors 20 in first area 9. Each nonvolatile memory transistor 20 may be formed from a plurality of nonvolatile memory transistors 20A connected in parallel. In this case, a plurality of active areas 31 are disposed adjacent each other in spaced relation. Self-aligned source regions 32 may extend across a number of active areas 31 and connect the source regions of nonvolatile memory transistors 20A in adjacent active areas 31. Strips of polysilicon 33, in this case being a second layer of polysilicon (the first layer of polysilicon forms the floating gate of nonvolatile memory transistors 20A and will not be shown in FIG. 3 for reasons of clarity), may extend in substantially perpendicular relation to active areas 31 and form the gate/control terminal of the nonvolatile memory transistors 20A. As shown in FIG. 3, active areas 31, self-aligned source regions 32 and polysilicon areas 33 define a plurality of nonvolatile memory transistors 20A, whereby the drain and source regions of the nonvolatile memory transistors 20A are positioned in active areas 31 along either side of the area of intersection of polysilicon strips 33 and active areas 31. Along each active area 31, adjacent nonvolatile memory transistors 20A share a common source region.

Contacts 34 and segments of a first layer of metal (not shown in FIG. 3 for reasons of clarity) may connect the drain regions of the nonvolatile memory transistors 20A to a bit line BL. Further, the self-aligned source region 32 of each group of parallel-connected nonvolatile memory transistors 20A is connected to a segment 36 of the first layer of metal through contact 37 which forms an intermediate line IM. Intermediate lines IM extend from first area 9 to second area 10 so as to connect the nonvolatile memory transistor 20A of a PLD cell with the corresponding select transistors 21 thereof.

A number of characteristics of the layout of nonvolatile memory transistors 20A illustrated in FIG. 3 will be noted. First, despite first metal segments connecting together nonvolatile memory transistors 20A in five adjacent active areas 31, eight nonvolatile memory transistors 20A (in four adjacent active areas 31) are utilized. Specifically, a pair of dummy transistors 20B are disposed adjacent each group of parallel-connected nonvolatile memory transistors 20A and provides isolation. Second, contacts 37 for each intermediate line IM are staggered along either side of the nonvolatile memory transistors 20A so as to provide isolation and avoid leakage between adjacent groups of nonvolatile memory transistors 20A.

It is understood that nonvolatile memory transistors 20 may have a different physical layout relative to the physical layout of FIG. 3.

An exemplary physical layout of a portion of second area 10 is illustrated in FIG. 4. Active areas 41 are defined in a substrate of semiconductor material. Segments 42 of a polysilicon layer, such as the second layer of polysilicon, may be defined laterally across active areas 41 so as to form the gate/control terminal of select transistors 21, with the drain and source regions thereof being disposed along either side of the portions of active areas 41 overlapped by segments 42. Polysilicon segments 42 may extend towards input circuitry 6 so that the input of PLD device 2 may be applied to the gate terminals of select transistors 21. Source lines SL, defined in a metal layer such as a second metal layer, extend along active areas 41 and are connected to the source terminals of select transistors 21 using contacts 43. Intermediate lines IM extend from the corresponding first area 9 and may be connected to the drain terminals of select transistors 21 using contacts 44. The source lines SL may be routed to sense amplifier circuits 4, as shown in FIG. 1.

Figure 5:
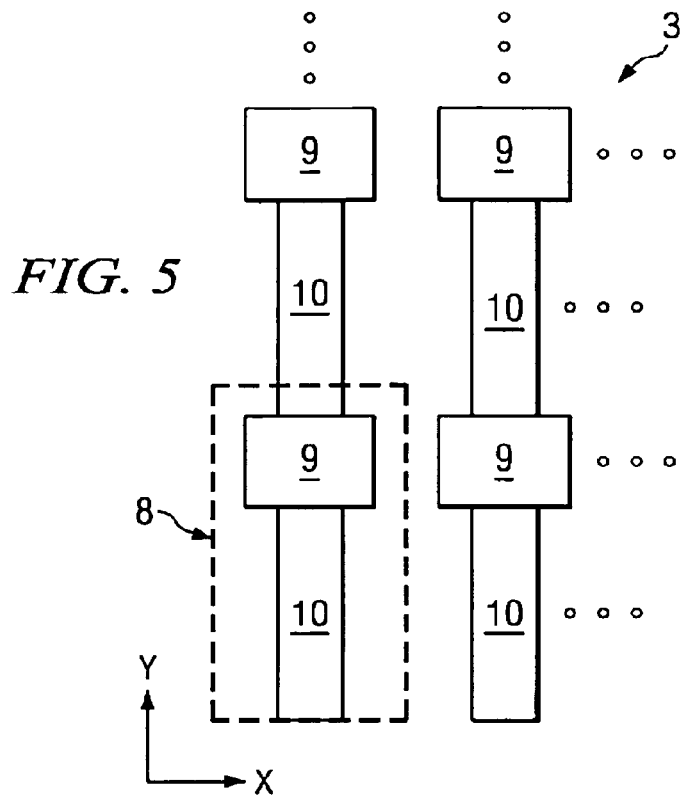
FIG. 5 is a top elevational view of a portion of the PLD device of FIG. 1.

As stated above, the first area 9 of a block 8 of PLD cells is disposed in the integrated circuit chip 1 adjacent the corresponding second area 10. FIG. 5 illustrates an exemplary layout of array 3 in which blocks 8 are arrayed in two dimensions. In this case, adding a block 8 of PLD cells in the X direction increases the number of bit lines, and adding a block 8 of PLD cells in the Y direction increases the number of PLD cells (product terms) per bit line.

A benefit of having the nonvolatile memory transistors 20 disposed in a separate area from the corresponding select transistor 21 is that process integration issues are substantially reduced. As a result of separating nonvolatile memory transistors 20 from select transistors 21 as described above, there is less change in process flow and device control in fabricating integrated circuit chip 1. In addition, reliability issues relating to fabricating nonvolatile memory transistors and select transistors, such as relating to defectivity and tunnel oxide integrity, are substantially reduced.

Further, the separation of nonvolatile memory transistors 20 from select transistors 21 allows for array 3 to be more easily fabricated using existing processing steps and design rules associated with the fabrication of nonvolatile memory devices. In this way, integrated circuit chip 1 may be fabricated to include both PLD array 2 and a nonvolatile memory 11 (FIG. 1) without a significant increase in processing steps relative to the processing steps necessary for fabricating nonvolatile memory 11. For instance, nonvolatile memory 11 may be a flash memory, and nonvolatile memory transistors 20 may be flash memory transistors, wherein array 3 of PLD cells may be fabricated using existing flash memory processing steps and design rules. The nonvolatile memory transistor 20 may have the same transistors architecture as a floating gate transistor in nonvolatile memory 11. As a result, integrated circuit chip 1 may be fabricated relatively inexpensively and with increased reliability.

Figure 6:
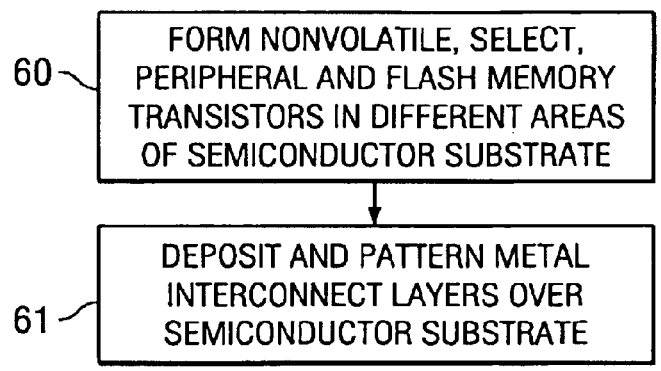
FIG. 6 is a flow chart illustrating a method of fabricating the PLD device of FIG. 1.

A method of fabricating PLD 2 and/or an integrated circuit chip 1 having PLD 2 embedded therein will be described with reference to FIG. 6. The steps include forming at 60 a plurality of nonvolatile memory transistors 20 in a first area of a semiconductor substrate; a plurality of select transistors 21 in a second area of the semiconductor substrate separate from the first area; transistors in a third area of the semiconductor substrate dedicated for peripheral circuitry for PLD 2 (input circuitry 6, reference generator circuitry 7, sense amplifiers 4, NOR plane circuitry 5, etc.); and (optionally) nonvolatile memory transistors and select transistors in a fourth area of the semiconductor substrate dedicated to a flash memory 11 of the integrated circuit chip 1. Each of the nonvolatile memory transistors 20 may be formed from a plurality of nonvolatile memory transistors 20A, as described above.

Next, metal interconnect layers are deposited and patterned on the semiconductor substrate at 61 so as to connect together in parallel, for each nonvolatile memory transistor 20, the nonvolatile memory transistors 20A forming the nonvolatile memory transistor 20. In addition, the metal interconnect layers may connect together in parallel select transistors 21 to form pairs of parallel-connected select transistors 21. Further, the metal layers may be routed between the first and second areas so as to connect together each nonvolatile memory transistor 20 to its corresponding select transistor 21. The metal interconnect layers may also connect together transistors in the third area to form the peripheral circuitry of PLD 2, and the transistors in the fourth area so as to form the flash memory 11.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit, comprising:
a programmable logic device (PLD), comprising:
an array of PLD cells, each of a plurality of PLD cells comprising a nonvolatile transistor and a select transistor connected in series between a bit line and a source line, a control terminal of the nonvolatile transistor being connected to a predetermined voltage level and a control terminal of the select transistor being coupled to an input of the PLD, the nonvolatile transistors being disposed in at least one first area within the array and the select transistors being disposed in at least one second area within the array, the at least one second area being disposed adjacent the at least one first area;
a plurality of sense amplifiers, each sense amplifier being coupled to a distinct source line; and
an array of combinational logic having inputs coupled to the sense amplifiers and at least one output coupled to an output of the PLD.

2. The integrated circuit of claim 1, further comprising a nonvolatile memory device having a layout conforming to a set of design rules for nonvolatile memory devices, the layout of the array of PLD cells conforming to the set of design rules for nonvolatile memory devices.

3. The integrated circuit of claim 2, wherein the nonvolatile memory device comprises a flash memory device and the nonvolatile transistors of the PLD cell array comprises flash memory transistors.

4. The integrated circuit of claim 2, wherein the nonvolatile memory device comprises a plurality of floating-gate transistors, the nonvolatile transistors of the PLD cell array comprises floating-gate transistors, and the floating-gate transistors of the nonvolatile memory device and the floating-gate transistors of the PLD cell array having substantially the same transistor architecture.

5. The integrated circuit of claim 1, wherein the nonvolatile transistors are disposed in a plurality of first areas and the select transistors are disposed within a plurality of second areas separate from the first areas.

6. The integrated circuit of claim 5, wherein nonvolatile transistors in each first area forms PLD cells with select transistors in a distinct second area adjacent the first area.

7. The integrated circuit of claim 1, wherein electrical connections forming the PLD cells comprise segments from three layers of electrically-conductive material.

8. The integrated circuit of claim 1, wherein segments of electrically-conductive material within the at least one first area and segments of electrically-conductive material within the at least one second area comprise segments from two layers of electrically-conductive material.

9. The integrated circuit of claim 1, wherein each of a plurality of the nonvolatile transistors comprises a plurality of first nonvolatile transistors, the first nonvolatile transistors of a single nonvolatile transistor being disposed in at least two rows of transistors within the at least one first area.

10. The integrated circuit of claim 1, further comprising a plurality of isolation transistors disposed between adjacent nonvolatile transistors in the first area.

11. The integrated circuit of claim 9, wherein contacts to the nonvolatile transistors that allow electrical connections to corresponding select transistors are staggered.

12. A method of fabricating an integrated circuit, comprising:
forming a plurality of nonvolatile transistors in a first area of the integrated circuit;
forming a plurality of select transistors in a second area of the integrated circuit and a plurality of transistors in a third area; and
forming electrical interconnections between nonvolatile transistors in the first area and select transistors in the second area so as to form a plurality of programmable logic device (PLD) cells, each of a plurality of PLD cells comprising a nonvolatile transistor connected in series with a distinct select transistor, to electrically connect transistors in the third area with each other to form combinatorial logic circuitry; and to electrically connect the PLD cells to transistors in the third area.

13. The method of claim 12, further comprising:
forming an array of nonvolatile transistors in a fourth area of the integrated circuit, the nonvolatile transistors in the first area and the nonvolatile transistors in the fourth area following the same set of layout design rules.

14. The method of claim 12, further comprising:
forming an array of nonvolatile transistors in a fourth area of the integrated circuit, the nonvolatile transistors in the first area and the nonvolatile transistors in the fourth area having substantially the same transistor architecture.

15. The method of claim 12, wherein the nonvolatile transistors are floating gate transistors.

16. The method of claim 12, wherein the nonvolatile transistors are flash memory transistors.

17. The method of claim 12, wherein the step of forming electrical interconnections comprises connecting a plurality of PLD cells in parallel between at least one bit line and at least one source line.

18. The method of claim 12, wherein the step of forming the nonvolatile transistors forms the nonvolatile transistors in a plurality of first areas, the step of forming the select transistors forms the select transistors in a plurality of second areas, each second area being adjacent a first area.

19. The method of claim 18, wherein the step of forming electrical interconnections connects nonvolatile transistors in each first area with select transistors in the second area adjacent thereto to form the PLD cells.

20. The method of claim 19, wherein the PLD cells from a first area and the select transistors in the second area adjacent thereto form a PLD block, the integrated circuit having an array of PLD blocks.

21. An integrated circuit, comprising:
programmable logic device (PLD), comprising:
a plurality of floating gate transistors disposed in at least one first area of a semiconductor substrate;
a plurality of field effect transistors disposed in at least one second area of the semiconductor substrate; and
a plurality of layers of electrically conductive material disposed over the semiconductor substrate and electrically connecting the floating gate transistors and the field effect transistors so as to form a plurality of PLD cells, each of the plurality of PLD cells comprising a floating gate transistor connected in series with at least one distinct field effect transistor, the plurality of PLD cells being connected between at least one source line and at least one bit line.

22. The integrated circuit of claim 21, wherein the PLD device further comprises a plurality of transistors in a third area of the semiconductor substrate, the layers of electrically conductive material connecting the transistors in the third area together so as to form combinatorial logic circuitry and connecting the at least one bit line to the combinatorial logic circuitry, the combinatorial logic circuitry generating at least one output signal of the PLD device.

23. The integrated circuit of claim 21, wherein the layers of electrically conductive material couple gate terminals of the field effect transistors to inputs of the PLD device.

24. The integrated circuit of claim 21, wherein the floating gate transistors are disposed in a plurality of first areas and the plurality of field effect transistors are disposed in a plurality of second areas, the layers of electrically conductive material forming PLD cells with the floating gate transistors in a first area with the field effect transistors in a second area adjacent the first area.

25. The integrated circuit of claim 24, wherein each pair of a first area and a corresponding second area adjacent thereto is replicated a plurality of times.

26. The integrated circuit of claim 21, further comprising a nonvolatile memory device having a plurality of nonvolatile memory cells, each of a plurality of nonvolatile memory cells including a floating gate transistor having substantially the same architecture as the floating gate transistors of the PLD device.

27. The integrated circuit of claim 21, further comprising a nonvolatile memory device having a plurality of nonvolatile memory cells, each of a plurality of nonvolatile memory cells including a floating gate transistor having a layout that conforms to the same set of design rules as the layout of the floating gate transistors of the PLD device.

28. An integrated circuit, comprising:
a plurality of floating gate transistors disposed in a first area of a semiconductor substrate;
a plurality of field effect transistors disposed in a second area of the semiconductor substrate that is adjacent to the first area; and means for electrically connecting the plurality of floating gate transistors and the plurality of field effect transistors to form an array of programmable logic device (PLD) cells, each PLD cell comprising a selected one of the plurality of floating gate transistors from the first area and a selected field effect transistor from the second area.

29. The integrated circuit of claim 28 wherein the means for electrically connecting comprises a plurality of layers of electrically conductive material disposed over the semiconductor substrate and electrically connecting the floating gate transistors and the field effect transistors so as to form the array of PLD cells.

30. The integrated circuit of claim 28 wherein the means for electrically connecting comprises a series circuit connection between the selected floating gate transistor and the selected field effect transistor.

31. The integrated circuit of claim 28 wherein each of the plurality of PLD cells is connected between at least one source line and at least one bit line.

32. The integrated circuit of claim 28, further comprising:
a plurality of transistors disposed in a third area of the semiconductor substrate, wherein the means for electrically connecting connects the transistors in the third area together so as to form combinatorial logic circuitry and connects to the PLD cells.

33. A method of fabricating an integrated circuit, comprising:
forming a plurality of nonvolatile transistors in a first area of the integrated circuit;
forming a plurality of select transistors in a second area of the integrated circuit, wherein the second area is adjacent to the first area; and
forming a plurality of programmable logic device (PLD) cells, each PLD cell formed by electrically interconnecting a selected one of the nonvolatile transistors from the first area with a selected one of the select transistors from the second area.

34. The method of claim 33 further comprising:
forming a plurality of transistors in a third area; and
forming electrical interconnections between the plurality of transistors in the third area to define combinatorial logic circuitry and electrically connect the combinational logic circuitry to the PLD cells.

35. The method of claim 33 wherein forming of the PLD cells comprises electrically connecting the selected one of nonvolatile transistors in series with the selected one of the select transistors.

36. The method of claim 33, wherein the nonvolatile transistors are floating gate transistors.

37. The method of claim 33, wherein the nonvolatile transistors are flash memory transistors.

38. The method of claim 33, wherein forming of the PLD cells comprises electrically interconnecting the plurality of PLD cells in parallel between at least one bit line and at least one source line.

39. An integrated circuit, comprising:
an array of PLD cells, each PLD cell comprised of a selected one of a plurality of nonvolatile transistors all located in a first area of a substrate and a selected one of a plurality of select transistors all located in a second area of the substrate adjacent the first area, each PLD cell being connected between a bit line and a source line:
a plurality of sense amplifiers, each sense amplifier being coupled to a distinct source line; and
an array of combinational logic having inputs coupled to the sense amplifiers and at least one output.

40. The integrated circuit of claim 39 wherein a control terminal of each nonvolatile transistor is connected to a predetermined voltage level and a control terminal of each select transistor is coupled to a PLD input.

41. The integrated circuit of claim 39, wherein the nonvolatile transistors comprise flash transistors.

42. The integrated circuit of claim 39, wherein the nonvolatile transistors comprise floating-gate transistors.

* * * * *